(12) United States Patent
Ker et al.

(10) Patent No.: US 6,747,501 B2
(45) Date of Patent: Jun. 8, 2004

(54) DUAL-TRIGGERED ELECTROSTATIC DISCHARGE PROTECTION CIRCUIT

(75) Inventors: Ming-Dou Ker, Hsinchu (TW); Kei-Kang Hung, Changhua (TW); Hsin-Chin Jiang, Taipei (TW)

(73) Assignee: Industrial Technology Research Institute (TW)

( * ) Notice: Subject to any disclaimer, the term of this patent is extended or adjusted under 35 U.S.C. 154(b) by 0 days.

(21) Appl. No.: 09/903,547

(22) Filed: Jul. 13, 2001

(65) Prior Publication Data

US 2003/0011949 A1 Jan. 16, 2003

(51) Int. Cl.⁷ .............................................. H03K 5/08
(52) U.S. Cl. ........................ 327/310; 327/318; 327/324
(58) Field of Search ................................ 327/309, 310, 327/313, 314, 318–320, 324, 534, 537; 361/56, 111; 257/355, 356

(56) References Cited

U.S. PATENT DOCUMENTS

| | | | |
|---|---|---|---|
| 4,939,616 A | 7/1990 | Rountree | 361/56 |
| 5,012,317 A | 4/1991 | Rountre | 361/56 |
| 5,225,702 A | 7/1993 | Chatterjee | 257/360 |
| 5,453,384 A | 9/1995 | Chatterjee | 438/135 |
| 5,465,189 A | 11/1995 | Polgreen et al. | 361/58 |
| 5,502,328 A | 3/1996 | Chen et al. | 257/546 |
| 5,519,242 A | 5/1996 | Avery | 257/356 |
| 5,581,104 A | 12/1996 | Lowrey et al. | 257/355 |
| 5,629,544 A | 5/1997 | Voldman et al. | 257/355 |
| 5,631,793 A | 5/1997 | Ker et al. | 361/56 |
| 5,646,808 A | 7/1997 | Nakayama | 361/56 |
| 5,654,862 A | 8/1997 | Worley et al. | 361/111 |
| 5,719,737 A | 2/1998 | Maloney | 361/111 |
| 5,754,381 A | 5/1998 | Ker | 361/56 |
| 5,807,791 A | 9/1998 | Bertin et al. | 438/738 |
| 5,811,857 A | 9/1998 | Assaderaghi et al. | 257/355 |
| 5,859,758 A * | 1/1999 | Kim | 361/111 |
| 5,901,022 A * | 5/1999 | Ker | 361/56 |
| 5,907,462 A | 5/1999 | Chatterjee et al. | 361/56 |
| 5,910,874 A | 6/1999 | Iniewski et al. | 361/56 |
| 5,932,918 A | 8/1999 | Krakauer | 257/368 |
| 5,940,258 A | 8/1999 | Duvvury | 361/56 |
| 5,959,488 A * | 9/1999 | Lin et al. | 327/313 |
| 5,990,520 A | 11/1999 | Noorlag et al. | 257/362 |
| 6,015,992 A | 1/2000 | Chatterjee et al. | 257/350 |
| 6,034,397 A | 3/2000 | Voldman | 257/355 |
| 6,081,002 A | 6/2000 | Amerasekera et al. | 257/173 |
| 6,097,235 A * | 8/2000 | Hsu et al. | 327/309 |
| 6,256,184 B1 * | 7/2001 | Gauthier Jr. et al. | 361/111 |

OTHER PUBLICATIONS

M–D. Ker, et al., "CMOS On–Chip ESD Protection Design with Substrate–triggering Technique," Proc. of ICECS, vol. 1, pp. 273–276, 1998.
C. Duvvury et al., "Dynamic Gate Coupling for NMOS for Efficient Output ESD Protection", Proc. of IRPS, pp. 141–150, 1992.

(List continued on next page.)

Primary Examiner—Terry D. Cunningham
Assistant Examiner—Long Nguyen
(74) Attorney, Agent, or Firm—Finnegan, Henderson, Farabow, Garrett & Dunner, L.L.P.

(57) ABSTRACT

An integrated circuit that includes a signal pad, a clamping circuit including a first NMOS transistor having a drain, a source, a gate and a substrate, wherein the drain of the first NMOS transistor is coupled to the signal pad and the source of the first NMOS transistor is coupled to ground, and a control circuit coupled to the gate and substrate of the first NMOS transistor and the signal pad, the control circuit providing a first bias voltage signal to the gate and a second bias voltage signal to the substrate. The voltage level of the first bias voltage signal may be equal to, greater than, or less than the second bias voltage signal. By independently optimizing the trigger levels of the substrate and gate of the transistor in the clamping circuit, a robust ESD protection circuit can be obtained to suit the requirements of different process technologies.

35 Claims, 6 Drawing Sheets

OTHER PUBLICATIONS

S. Voldman, et al., "Semiconductor Process and Structural Optimization of Shallow Trench Isolation–Defined and Polysilicon–Bound Source/Drain Diodes for ESD Networks," in Proc. of EOS/ESD Symp., 1998, pp. 151–160.

S. Voldman, et al., "Analysis of Snubber–Clamped Diode–String Mixed Voltage Interface ESD Protection Network for Advanced Microprocessors," in Proc. of EOS/ESD symposium, 1995, pp. 43–61.

M.J. Pelgrom, et al., "A 3/5 V Compatible I/O Buffer," IEEE Journal of Solid–State Circuits, vol. 30, No. 7, pp.823–825, Jul. 1995.

G.P. Singh, et al., "High–Voltage–Tolerant I/OBuffers with Low–Voltage CMOS Process," IEEE Journal of Solid–State Circuits, vol.34, No. 11, pp. 1512–1525, Nov. 1999.

H. Sanchez, et al., A Versatile 3.3/2.5/1.8–V CMOS I/O Driver Built in 02. –$\mu$m, 3.5–nm Tox, 1.8 –V CMOS Technology, IEEE Journal of Solid–State Circuits, vol.34 No. 11.pp. 1501–1511, Nov. 1999.

C. Richier, P. Salome, G. Mabboux, I. Zaza, A. Juge, and P. Mortini, Investigation on Different ESD Protection Strategies Devoted to 3.3V RF Applications (2 (GHz) in a 0.18$\mu$m CMOS Process, in Proc. of EOS/ESD Symp., 200, pp. 251–259.

T.–Y. Chen and M.–D. Ker, "Design on ESD Protection Circuit With Low and Constant Input Capacitance," in Proc. of IEEE Int. Symp. on Quality Electronic Design, 2001, pp. 247–247.

M.–D. Ker, T.–Y. Chen, C.–Y. Wu, and H.–H. Chang, ESD Protection Design on Analog Pin WIth Very Low Input Capacitance for RF or Current–Mode Applications, IEEE Journal of Solid–State Circuits, vol. 35, pp. 1194–1199, 2000.

N. K. Verghese and D. Allstot, "Verification of RF and Mixed–Signed Integrated Circuits for Substrate Coupling Effects", in Proc. of IEEE Custom Integrated Circuits Conf., 1997, pp. 363–370.

M.Xu, D. Su, D. Shaeffer, T.Lee, and B. Wooley, Measuring and Modeling the Effects of Substrate Noise on LNA for a CMOS GPS Receiver, IEEE Journal of Solid–State Circuits, vol. 36, pp. 473–485, 2001.

R. Gharpurey, "A Methodology for Measurement and Characterization of Substrate Noise in High Frequency Circuits," in Proc. of IEEE Custom Integrated Circuits Conf., 1999, pp. 487–490.

M. Nagata, J. Nagai, K. Hijikata, T. Morie, and A. Iwata, PhysicalDesign Guides for Substrate Noise Reduction in CMOS Digital Circuits, IEEE Journal of Solid–State Circuits, vol. 36, pp. 539–549, 2001.

M.–D. Ker, T–Y, Chen, C–Y. Wu, and H.–H. Chang, ESD Protection Design on Analog Pin WIth Very Low Input Capacitance for High–Frequency or Current–Mode Applications, IEEE Journal of Solid–State Circuits, vol. 35, pp. 1194–1199, 2000.

M.–D. Ker, Whole–Chip ESD Protection Design with Efficient VDD–to–VSS ESD Clamp Circuit for Submicron CMOS VLSI, IEEE Trans. on Electron Devices, vol. 46, pp. 173–183, 1999.

* cited by examiner

DUAL-TRIGGERED ELECTROSTATIC DISCHARGE PROTECTION CIRCUIT

BACKGROUND OF THE INVENTION

1. Field of the Invention

This invention pertains in general to a semiconductor device, and, more particularly, to a dual-triggered electrostatic discharge protection circuit.

2. Description of the Related Art

A semiconductor integrated circuit (IC) is generally susceptible to an electrostatic discharge (ESD) event that may damage or destroy the IC. An ESD event refers to a phenomenon of electrical discharge of a current (positive or negative) for a short duration in which a large amount of current is discharged through the IC. The high current may be built-up from a variety of sources, such as the human body. Many schemes have been implemented to protect an IC from an ESD event.

A common protection scheme uses a parasitic transistor associated with an n-type metal-oxide semiconductor (NMOS) with the source coupled to ground and the drain connected to an input or output pad from which an ESD current enters to protect an internal circuit. In deep sub-micron complementary metal oxide silicon (CMOS) technology, thin oxides are required. As an oxide layer becomes thinner, the breakdown voltage of the oxide becomes lower. Therefore, an ESD protection scheme must accordingly lower the trigger voltage. The known protection scheme described above is triggered at a level close to that of the oxide breakdown voltage and therefore may be inadequate for ESD protection.

Figure 1:
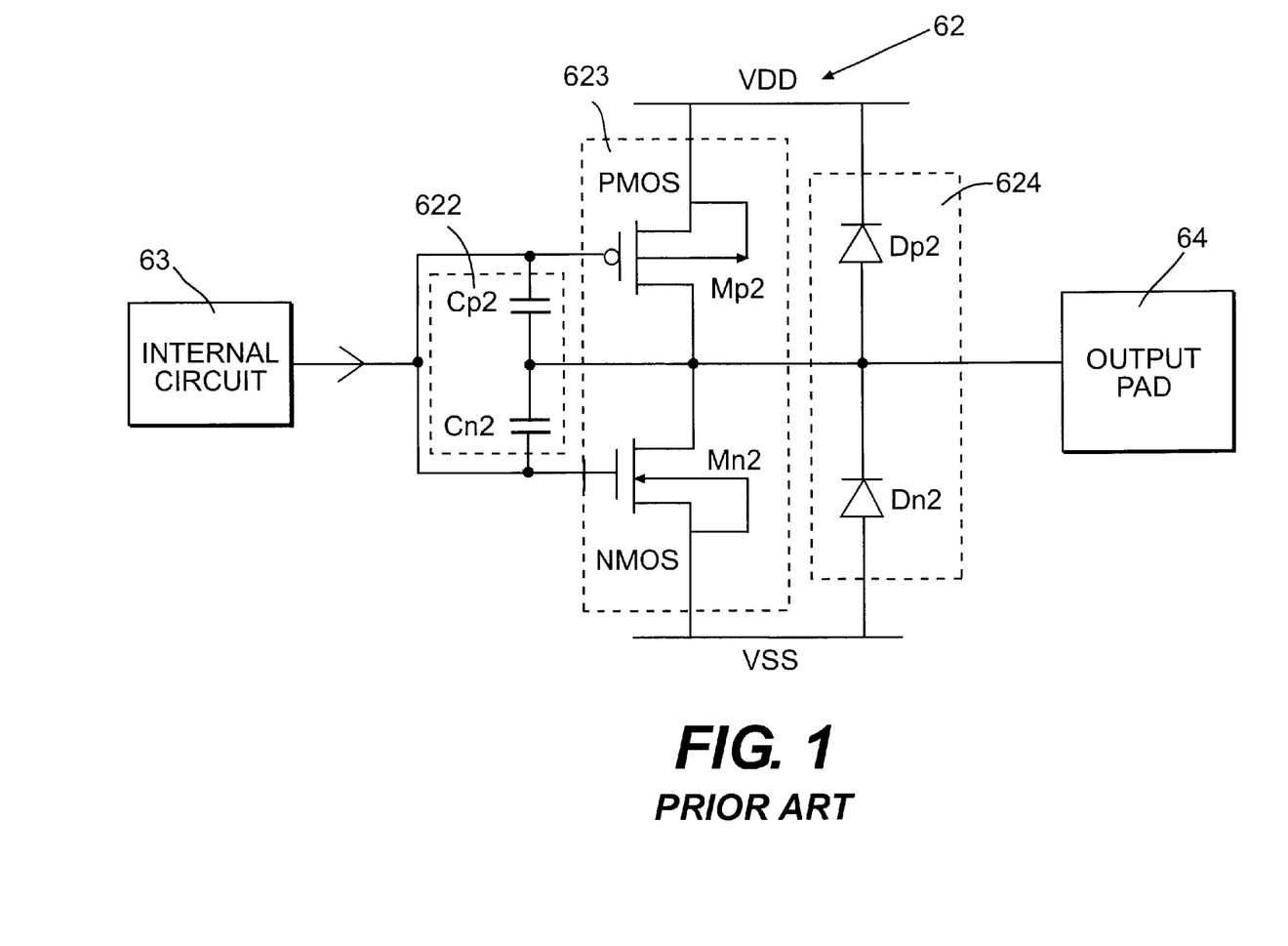
FIG. 1 shows a circuit diagram of a known ESD protection circuit.

FIG. 1 is a reproduction of FIG. 2 of U.S. Pat. No. 5,631,793 to Ker et al, Ker being one of the inventors of the present invention. Ker et al. describes a capacitor-coupled ESD protection circuit that includes an ESD bypass device 623 to discharge an ESD current, and a capacitor-coupled circuit 622 to couple a portion of the voltage to an ESD clamping device. The ESD bypass device 623 include a PMOS transistor Mp2 and an NMOS transistor Mn2. The substrate of the PMOS transistor Mp2 is coupled to the source of the PMOS transistor, and the substrate of the NMOS transistor Mn2 is coupled to the source of the NMOS transistor.

Figure 2:
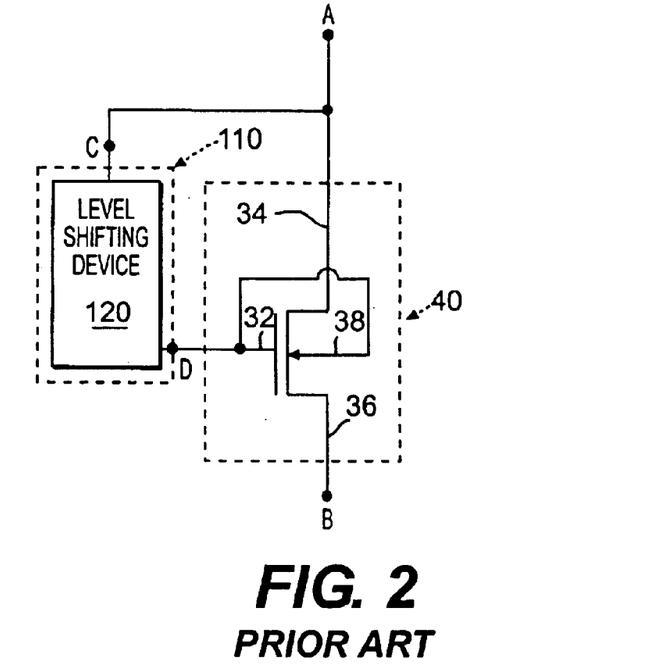
FIG. 2 is a circuit diagram of another known ESD protection circuit.

FIG. 2 is a reproduction of FIG. 28 of U.S. Pat. No. 5,811,857 to Assaderaghi et al., entitled "Silicon-on-Insulator Body-Coupled Gated Diode for Electrostatic Discharge (ESD) and Analog Applications." Assaderaghi et al. describes a clamping device consisting of a MOS transistor having the gate and body (substrate) connected together. As the gate and substrate voltage increase, the threshold voltage of the MOS transistor decreases. Referring to FIG. 2, the drain 34 is coupled to a level shifting device 110, which in turn is coupled to the gate 32 of the MOS transistor 40. The gate 32 is coupled to the body (or substrate) 38 of the MOS transistor 40.

SUMMARY OF THE INVENTION

Accordingly, the present invention is directed to a dual-triggered electrostatic discharge protection circuit that substantially obviates one or more of the problems due to limitations and disadvantages of the related art.

Additional features and advantages of the invention will be set forth in the description which follows, and in part will be apparent from the description, or may be learned by practice of the invention. The objectives and other advantages of the invention will be realized and attained by the structures and methods particularly pointed out in the written description and claims thereof, as well as the appended drawings.

To achieve these and other advantages, and in accordance with the purpose of the invention as embodied and broadly described, there is provided an electrostatic discharge protection circuit that includes a clamping circuit including a first transistor, the first transistor having a drain, a source, a gate and a substrate, and a control circuit coupled to the clamping circuit, the control circuit being coupled to the gate and substrate of the first transistor and providing a first bias voltage signal to the gate of the first transistor and a second bias voltage signal to the substrate of the first transistor to trigger the clamping circuit to discharge an electrostatic current.

In one aspect of the invention, the first bias voltage is equal to, greater than, or less than the second bias voltage.

In another aspect of the invention, the control circuit comprises a second transistor and at least one diode having a first end and a second end, wherein the second transistor is coupled to the first end of the at least one diode.

Also in accordance with the present invention, there is provided an integrated circuit that includes signal receiving means for receiving an electrostatic signal, clamping means for directing the electrostatic signal to ground, the clamping means having a first end and a second end, the first end being coupled to the signal receiving means and the second end being coupled to ground, and control means coupled to the clamping circuit for providing a first voltage signal and a second voltage signal to trigger the clamping means to direct the electrostatic signal to ground.

In one aspect of the invention, the control means comprises a first transistor, at least one diode having a first end and a second end, and a second transistor, the first transistor being coupled to the first end of the at least one diode and the second transistor being coupled to the second end of the at least one diode.

Additionally in accordance with the present invention, there is provided an integrated circuit that includes a signal pad, a clamping circuit including a first NMOS transistor having a drain, a source, a gate and a substrate, wherein the drain of the first NMOS transistor is coupled to the signal pad and the source of the first NMOS transistor is coupled to ground, and a control circuit coupled to the gate and substrate of the first NMOS transistor and the signal pad, the control circuit providing a first bias voltage signal to the gate and a second bias voltage signal to the substrate.

In one aspect of the invention, the circuit additionally includes a first diode having a first end and a second end and a second diode having a first end and a second end, wherein the first end of the first diode is coupled to the signal pad in parallel with the clamping circuit and the second end of the first diode is coupled to ground, and the first end of the second diode is coupled to a $V_{DD}$ signal and the second end of the second diode is coupled to the signal pad.

In another aspect of the invention, the control circuit includes a PMOS transistor having a source, a drain, a substrate and a gate, the source of the PMOS transistor being coupled to the signal pad, a plurality of serially coupled diodes, the drain of the PMOS transistor being coupled to a first of the plurality of serially coupled diodes, and a second NMOS transistor having a source, a drain, a gate, and a substrate, wherein the drain of the second NMOS transistor is coupled to a last of the serially coupled diodes, the source of the second NMOS transistor is coupled to ground, and the gate of the second NMOS transistor is coupled to the gate of the PMOS transistor.

In still another aspect, the substrate of the first NMOS transistor is coupled to any one of the plurality of serially coupled diodes.

In yet another aspect, the gate of the first NMOS transistor is coupled to any one of the plurality of serially coupled diodes.

Further in accordance with the present invention, there is provided an integrated circuit that includes a signal pad, a clamping circuit including a first PMOS transistor having a drain, a source, a gate and a substrate, wherein the drain of the first PMOS transistor is coupled to the signal pad and the source of the first PMOS transistor is coupled to a $V_{DD}$ signal, and a control circuit is coupled to the gate and substrate of the first PMOS transistor and the signal pad, the control circuit providing a first bias voltage signal to the gate and a second bias voltage signal to the substrate.

Also in accordance with the present invention, there is provided a method for protecting an integrated circuit from electrostatic discharge that includes receiving an electrostatic signal, providing a clamping circuit including a transistor having a substrate and a gate, providing a first bias signal to the substrate of the transistor, and providing a second bias signal to the gate of the transistor to trigger the transistor of the clamping circuit to conduct the signal to ground.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are incorporated in and constitute a part of this specification, illustrate embodiments of the invention and, together with the description, serve to explain the objects, advantages, and principles of the invention.

In the drawing.

DETAILED DESCRIPTION OF THE PREFERRED EMBODIMENTS

In accordance with the present invention, there is provided a dual-triggered ESD protection circuit. The protection circuit includes a clamping circuit having a MOS transistor and a control circuit coupled to the clamping circuit to provide bias voltages to the gate and substrate of the MOS transistor to trigger the clamping circuit for ESD protection. The MOS transistor may be a field-effect-transistor (MOSFET). The control circuit provides different bias voltages to the gate and substrate of the MOS transistor to trigger the clamping circuit at different trigger voltages. The present invention provides a clamping circuit having an improved robustness in ESD protection by reducing the trigger voltage of the clamping circuit. The dual-triggered ESD protection circuit may be implemented in both input and output regions of an integrated circuit.

Figure 3:
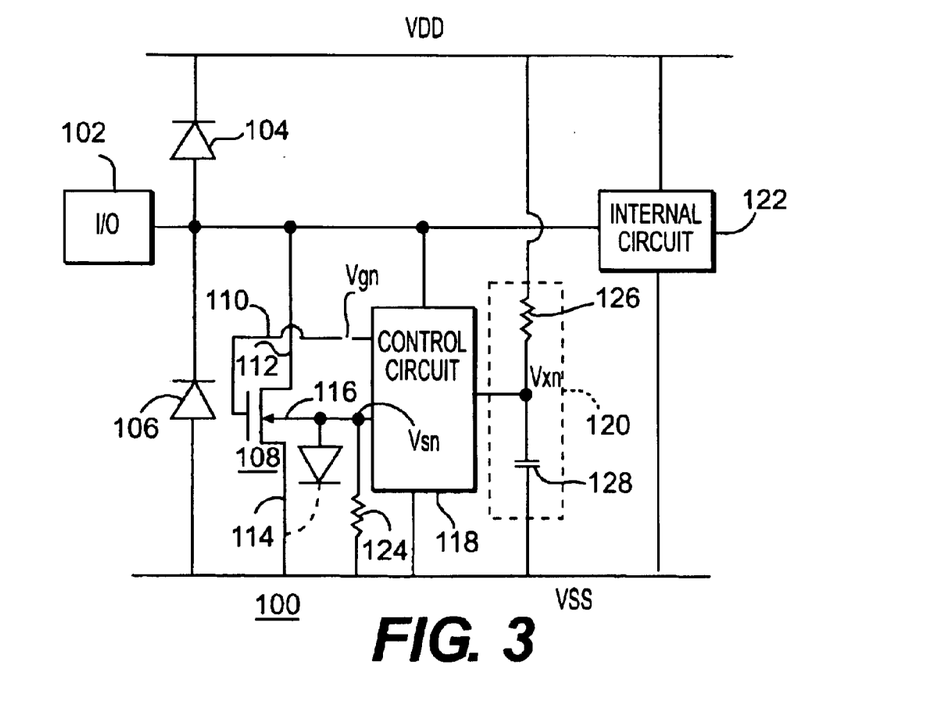
FIG. 3 shows a circuit diagram in accordance with one embodiment of the present invention.

FIG. 3 is a circuit diagram of one embodiment of the present invention. Referring to FIG. 3, an integrated circuit (IC) 100 includes an input/output signal pad 102 and an internal circuit 122 for which the present invention provides an ESD protection circuit to protect circuit 122. The IC 100 also includes a clamping circuit comprising of an n-type MOS (NMOS) transistor 108. The transistor 108 includes a drain 112, a gate 110, a source 114, and a substrate 116. The drain 112 is coupled to the input/output signal pad 102 and a control circuit 118. The source 114 is coupled to ground or $V_{SS}$. Both the gate 110 and the substrate 116 are coupled to the control circuit 118. There is a parasitic diode (not numbered) between the substrate 116 and source 114 of the transistor 108.

The control circuit 118 is coupled to the internal circuit 122 and a transient detection circuit 120. The transient detection circuit includes a resistor 126 and a capacitor 128 coupled in parallel to the control circuit 118. The resistor 126 is connected at one end to $V_{DD}$ and the capacitor 128 is connected at one end to $V_{SS}$. The IC 100 also includes a first parasitic diode 104 and a second parasitic diode 106. The cathode of the first diode 104 is coupled to $V_{DD}$. The anode of the first diode 104 is coupled to the input/output signal pad 102, the cathode of the second diode 106, the drain 112 of the transistor 108, the control circuit 118, and the internal circuit 122. The anode of the second diode 106 is connected to ground or $V_{SS}$. The IC 100 further includes a parasitic resistor 124 coupled between the substrate 116 of the transistor 108 and ground, or $V_{SS}$. The parasitic resistance is essentially the substrate resistance in the general CMOS technology.

Figure 4A:
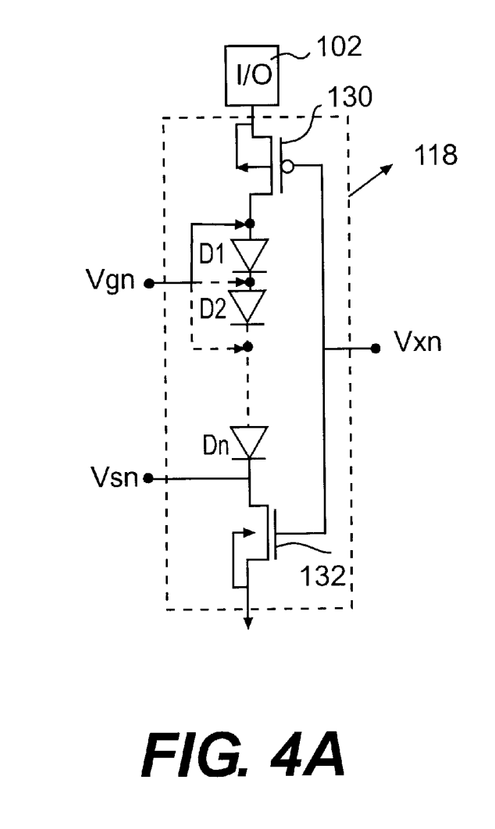
FIGS. 4A–4C are circuit diagrams of different embodiments of a control circuit in accordance with the present invention.
Figure 4B:
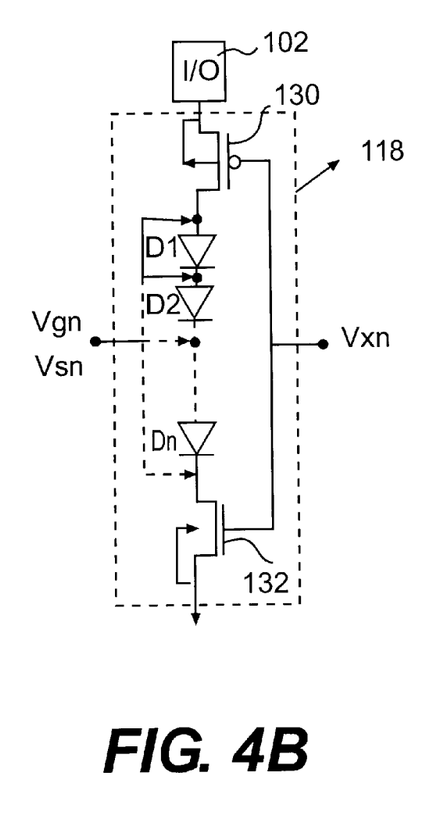
Figure 4C:
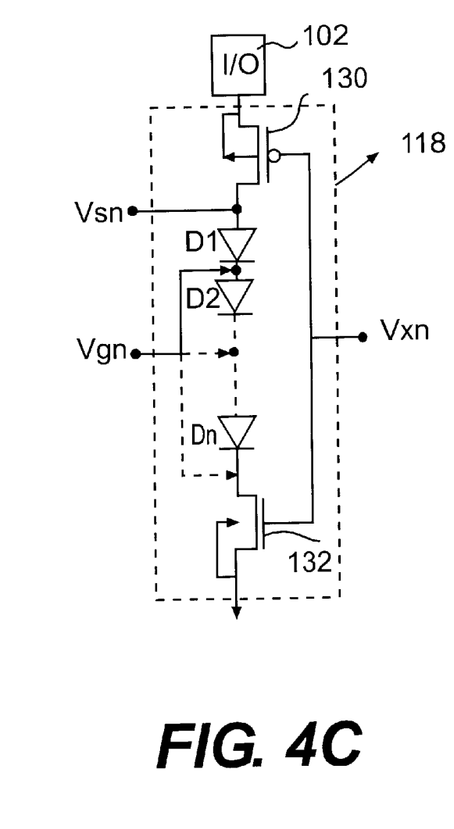

FIGS. 4A–4C show different embodiments of the control circuit 118. Referring to FIG. 4A, the control circuit 118 includes a p-type MOS (PMOS) transistor 130, a plurality of serially coupled diodes D1 ... Dn, and an NMOS transistor 132. In one embodiment, the control circuit 118 only includes one diode. The source of the transistor 130 is coupled to the input/output signal pad 102. The drain of the transistor 130 is coupled to the anode of the first diode D1 of the plurality of serially coupled diodes, and the gate of the transistor 130 is coupled to the gate of the transistor 132. The gates of transistors 130 and 132 provide a voltage Vxn to the transient detection circuit 120. Referring to FIG. 3, the gates of transistor 130 and 132 are coupled in parallel to the parallel resistor 126 and capacitor 128 of the transient detection circuit 120.

Referring again to FIG. 4A, the drain of the transistor 132 is coupled to the cathode of the last diode Dn of the plurality of serially coupled diodes, and the source is coupled to ground. With a reference to FIG. 3, the control circuit 118 provides a bias voltage Vsn to the substrate 116 of the transistor 108, and a bias voltage Vgn to the gate 110 of the transistor 108. The substrate bias voltage Vsn is provided from the cathode of the last diode Dn of the plurality of serially coupled diodes, and the gate bias voltage Vgn may be provided from an anode of any of the diodes D1 to Dn. The source of the transistor 130 is coupled to the drain 112 of the transistor 108.

As shown in FIGS. 4A to 4C, the control circuit 118 provides one of three combinations of bias voltages to the transistor 108. FIG. 4A shows a first combination in which the gate bias voltage Vgn is greater than the substrate bias voltage Vsn. FIG. 4B shows a second combination in which the gate bias voltage Vgn is equal to the substrate bias voltage Vsn. FIG. 4C shows a third combination in which the gate bias voltage Vgn is less than the substrate bias voltage Vsn.

In operation, the input/output signal pad 102 receives an electrostatic signal. When a positive ESD signal is received, and assuming the integrated circuit 100 is not powered-up, the diode 104 initially will be turned-on and conducts. The transistor 108 will be triggered to direct the ESD current to ground. During this operation, the PMOS transistor 130 is on and the NMOS transistor 132 is off. The ESD signal will forward-bias the plurality of serially coupled diodes D1 . . . Dn. A bias voltage is provided to the substrate 116 of the transistor 108 to forward-bias the substrate-source junction diode to trigger the transistor 108 to direct the ESD signal to ground. At the same time, the current that flows to the substrate 116 will induce a voltage drop across the plurality of diodes D1 . . . Dn. Because the gate 110 of the transistor 108 is coupled to one of the plurality of diodes D1 . . . Dn, the voltage drop is coupled to the gate 110 of the transistor 108 to trigger the transistor 108. In the case of a negative ESD signal the ESD signal will bypass through the diode 106.

During a power-up operation of a CMOS operation, the level of $V_{DD}$ increased from zero to a predetermined $V_{DD}$ level. The PMOS transistor 130 will be off and the NMOS transistor 132 turns on. The reference ground voltage level $V_{SS}$ will be coupled to the gate 110 of the transistor 108. The transistor 108 will be off because the threshold voltage of the transistor 108 is greater than the gate-to-source voltage, and the voltage on the drain 112 is less than the junction breakdown voltage of the NMOS transistor 108.

Figure 5:
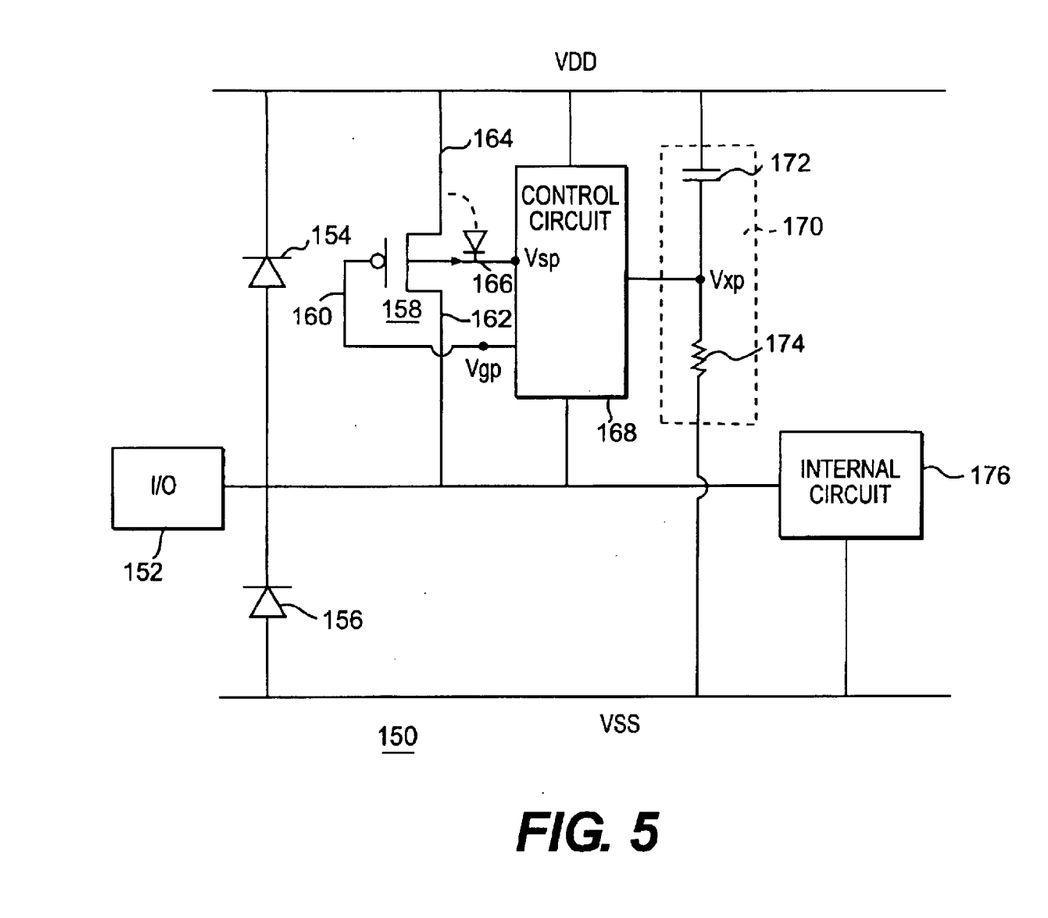
FIG. 5 is a circuit diagram in accordance with one embodiment of the present invention.

FIG. 5 is a circuit diagram of one embodiment of the present invention. Referring to FIG. 5, an integrated circuit (IC) 150 includes an input/output signal pad 152 and an internal circuit 176 from which the present invention provides an ESD protection circuit to protect. The IC 150 also includes a clamping circuit comprising of a p-type MOS (PMOS) transistor 158. The transistor 158 includes a drain 162, a gate 160, a source 164, and a substrate 166. The drain 162 is coupled to the input/output signal pad 152 and a control circuit 168. The source 164 is coupled to $V_{DD}$. Both the gate 160 and the substrate 166 are coupled to the control circuit 168. There is a parasitic diode (not numbered) between the substrate 166 and source 164 of the transistor 158.

The control circuit 168 is coupled to the internal circuit 176 and a transient detection circuit 170. The transient detection circuit includes a resistor 174 and a capacitor 172 coupled in parallel to the control circuit 168. The resistor 174 is connected at one end to $V_{SS}$ and the capacitor 172 is connected at one end to $V_{DD}$. The IC 150 also includes a first parasitic diode 154 and a second parasitic diode 156. The cathode of the first diode 154 is coupled to $V_{DD}$. The anode of the first diode 154 is coupled to the input/output signal pad 152, the cathode of the second diode 156, the drain 162 of the transistor 158, the control circuit 168, and the internal circuit 176. The anode of the second diode 156 is connected to ground or $V_{SS}$.

Figure 6A:
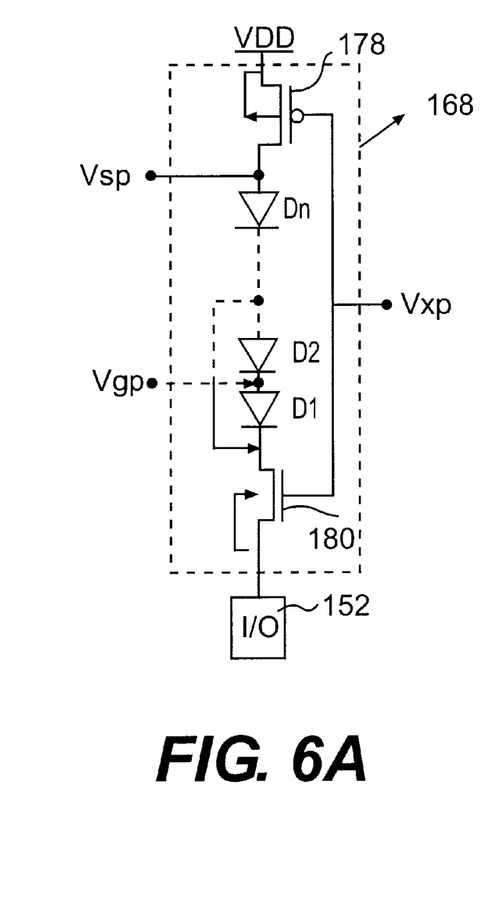
FIGS. 6A–6C are circuit diagrams of different embodiments of a control circuit in accordance with the present invention.
Figure 6B:
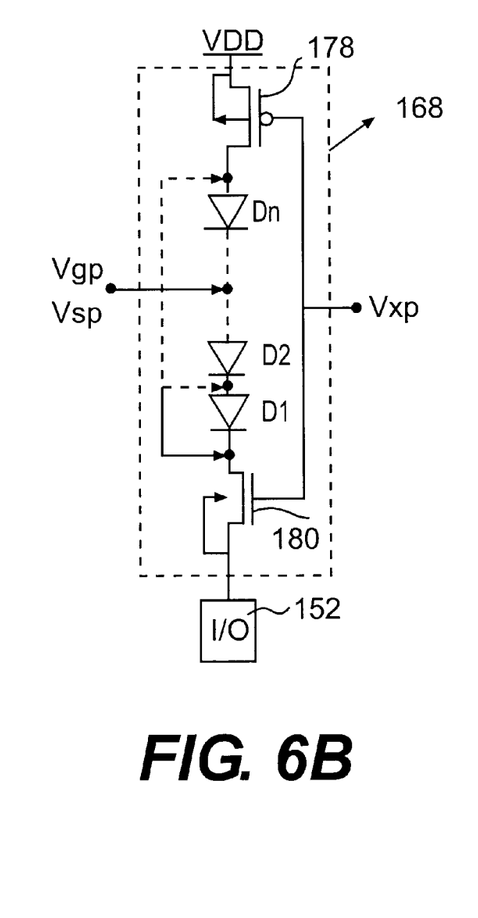
Figure 6C:
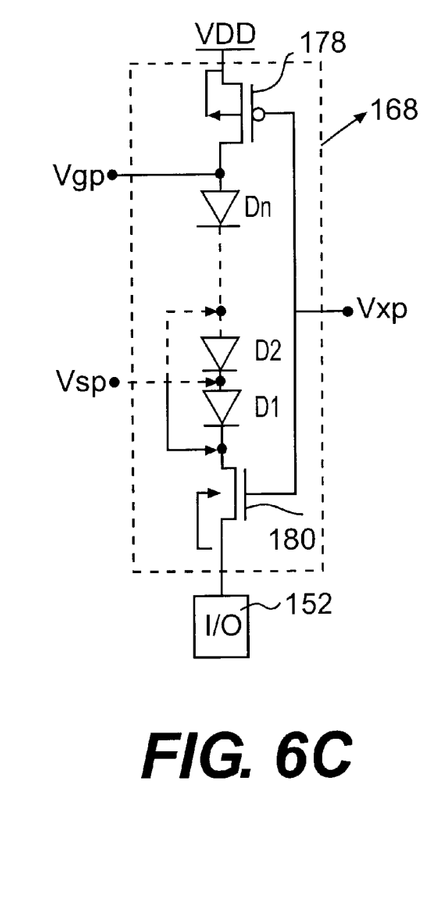

FIGS. 6A–6C show different embodiments of the control circuit 168. Referring to FIG. 6A, the control circuit 168 includes a p-type MOS (PMOS) transistor 178, a plurality of serially coupled diodes D1 . . . Dn, and an NMOS transistor 180. In one embodiment, the control circuit 168 only includes one diode. The source of the transistor 180 is coupled to the input/output signal pad 152. The drain of the transistor 180 is coupled to the cathode of the last diode Dn of the plurality of serially coupled diodes, and the gate of the transistor 180 is coupled to the gate of the transistor 178. The gates of transistors 180 and 178 provide a voltage Vxp to the transient detection circuit 170. Referring to FIG. 5, the gates of transistor 180 and 178 are coupled in parallel to the parallel resistor 174 and capacitor 172 of the transient detection circuit 170.

Referring again to FIG. 6A, the drain of the transistor 178 is coupled to the anode of the first diode D1 of the plurality of serially coupled diodes, and the source is coupled to $V_{DD}$. With a reference to FIG. 5, the control circuit 168 provides a bias voltage Vsp to the substrate 166 of the transistor 158, and a bias voltage Vgp to the gate 160 of the transistor 158. The substrate bias voltage Vsp is provided from the anode of the last diode Dn of the plurality of serially coupled diodes, and the gate bias voltage Vgp may be provided from a cathode of any of the diodes D1 to Dn. The source of the transistor 180 is coupled to the drain 162 of the transistor 158.

As shown in FIGS. 6A to 6C, the control circuit 168 provides one of three combinations of bias voltages to the transistor 158. FIG. 6A shows a first combination in which the gate bias voltage Vgp is less than the substrate bias voltage Vsp. FIG. 6B shows a second combination in which the gate bias voltage Vgp is equal to the substrate bias voltage Vsp. FIG. 6C shows a third combination in which the gate bias voltage Vgp is greater than the substrate bias voltage Vsp.

In operation, the input/output signal pad 152 receives an electrostatic signal. When a negative ESD signal is received, and assuming the integrated circuit 150 is not powered-up, the transistor 158 will be triggered to direct the ESD current to relative ground, $V_{DD}$. During this operation, the NMOS transistor 180 is on and the PMOS transistor 178 is off. The ESD signal will forward-bias the plurality of serially coupled diodes D1 . . . Dn. A bias voltage is provided to the substrate 166 of the transistor 158 to forward-bias the substrate-source junction diode to trigger the transistor 158 to direct the ESD signal to relative ground. At the same time, the current that flows to the substrate 166 will induce a voltage drop across the plurality of diodes D1 . . . Dn. Because the gate 160 of the transistor 158 is coupled to one of the plurality of diodes D1 . . . Dn, the voltage drop is coupled to the gate 160 of the transistor 158 to trigger the transistor 158. In the case of a positive ESD signal, the ESD signal will bypass through the diode 154 in the forward-bias condition.

During a power-up operation of a CMOS operation, the NMOS transistor 180 will be off and the PMOS transistor 178 turns on. The $V_{DD}$ voltage level will be coupled to the gate 160 of the transistor 158. The transistor 158 will be off because the absolute value of the threshold voltage of the transistor 158 is greater than the absolute value of the gate-to-source voltage, and the voltage on the drain 162 is less than the junction breakdown voltage of the transistor 158.

Figure 7:
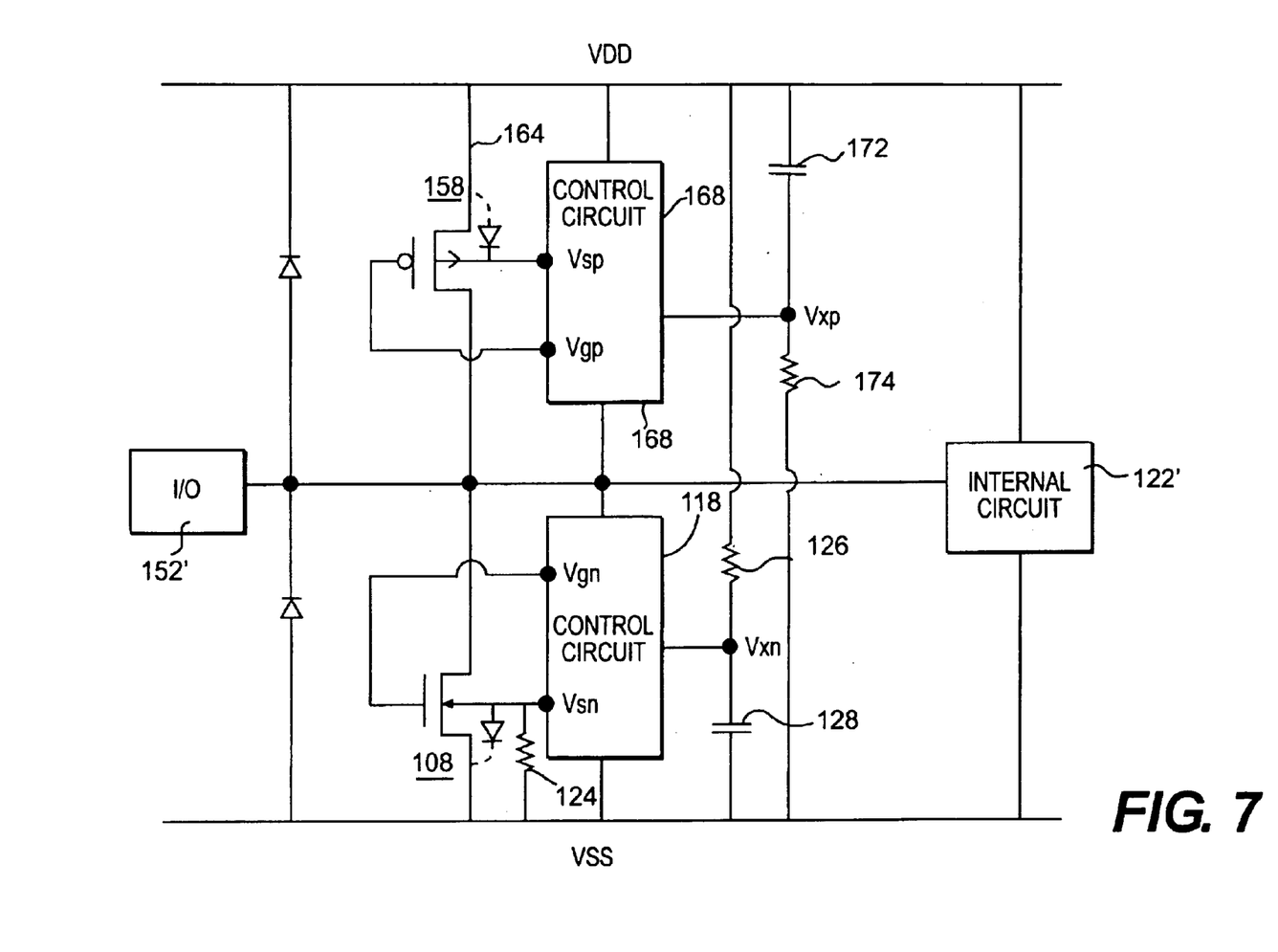
FIG. 7 is a circuit diagram in accordance with another embodiment of the present invention.

FIG. 7 shows another embodiment of the present invention, combing the embodiments shown in FIGS. 3 and 5, and therefore combining the functions of the two embodiments. An integrated circuit (IC) includes an input/output signal pad 152' and an internal circuit 122'. The IC also includes a clamping circuit comprising of an n-type MOS (NMOS) transistor 108. The transistor 108 includes a drain, a gate, a source, and a substrate. The source of the transistor 108 is coupled to ground or $V_{SS}$. Both the gate and substrate of the transistor 108 are coupled to the control circuit 118. There is a parasitic diode (not numbered) between the substrate and source of the transistor 108. The control circuit 118 is coupled to the internal circuit 122' and a transient detection circuit comprising a resistor 126 and a capacitor 128 coupled in parallel to the control circuit 118. The resistor 126 is connected at one end to $V_{DD}$ and the capacitor 128 is connected at one end to $V_{SS}$. The IC also includes a first parasitic diode and a second parasitic diode. The IC 100 further includes a resistor 124 coupled between the substrate of the transistor 108 and ground, $V_{SS}$.

The IC further includes a clamping circuit comprising of a p-type MOS (PMOS) transistor 158. The transistor 158 includes a drain, a gate, a source, and a substrate. The drain of the transistor 158 is coupled to the input/output signal pad 152' and a control circuit 168. The source of the transistor 158 is coupled to $V_{DD}$. Both the gate and substrate of the transistor 158 are coupled to the control circuit 168. There is a parasitic diode between the substrate and source of the transistor 158. The control circuit 168 is coupled to the internal circuit 122' and a transient detection circuit comprising a resistor 174 and a capacitor 172 coupled in parallel to the control circuit 168. The resistor 174 is connected at one end to $V_{SS}$ and the capacitor 172 is connected at one end to $V_{DD}$.

In operation, a dual-triggered clamping circuit greatly reduces the trigger voltage of the ESD protection circuit. The substrate bias voltage, or substrate trigger voltage, can be optimized by the dimension the MOS transistor and the number of serially coupled diodes. The gate bias voltage may be adjusted by choosing a connection point from the plurality of serially coupled diodes. By independently optimizing the trigger levels of the substrate and gate of the transistor in the clamping circuit, a robust ESD protection circuit may be obtained to suit the requirements of different process technologies.

Therefore, the present invention also includes a method for protecting a CMOS semiconductor device from electrostatic discharge. The method provides a clamping circuit including a transistor having a substrate and a gate, and provides a first bias signal to the substrate of the transistor. A second bias signal is provided to the gate of the transistor to trigger transistor of the clamping circuit to conduct the electrostatic signal to ground or relative ground. The voltage level of the first bias signal may be equal to, greater than, or less than the second bias signal.

It will be apparent to those skilled in the art that various modifications and variations can be made in the disclosed process without departing from the scope or spirit of the invention. Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. An electrostatic discharge protection circuit, comprising:
   a clamping circuit including a first transistor, the first transistor having a drain, a source, a gate and a substrate; and
   a control circuit having a second transistor and at least one diode, said at least one diode having a first end and a second end, the second transistor being coupled to the first end of the at least one diode,
   wherein said control circuit is coupled to the clamping circuit, the control circuit being coupled to the gate and substrate of the first transistor and providing a first bias voltage signal to the gate of the first transistor and a second bias voltage signal to the substrate of the first transistor to trigger the clamping circuit to discharge an electrostatic current, and wherein the first bias voltage signal is greater than the second bias voltage signal, wherein the first bias voltage is greater than the second bias voltage.

2. The circuit as claimed in claim 1, wherein the first transistor is an NMOS transistor.

3. The circuit as claimed in claim 1, wherein the first transistor is a PMOS transistor.

4. The circuit as claimed in claim 1, wherein the control circuit further comprises a third transistor coupled to the second end of the at least one diode.

5. The circuit as claimed in claim 4, wherein the third transistor is an NMOS transistor.

6. The circuit as claimed in claim 1, wherein the second transistor is a PMOS transistor.

7. The circuit as claimed in claim 1, wherein the control circuit comprises a plurality of diodes.

8. An electrostatic discharge protection circuit comprising:
   a clamping circuit including a first transistor, the first transistor having a drain, a source, a gate and a substrate; and
   a control circuit having a second transistor and at least one diode, said at least one diode having a first end and a second end, the second transistor being coupled to the first end of the at least one diode,
   wherein said control circuit is coupled to the clamping circuit, the control circuit being coupled to the gate and substrate of the first transistor and providing a first bias voltage signal to the gate of the first transistor and a second bias voltage signal to the substrate of the first transistor to trigger the clamping circuit to discharge an electrostatic current, and wherein the first bias voltage is less than the second bias voltage.

9. The circuit as claimed in claim 8, wherein the first transistor is an NMOS transistor.

10. The circuit as claimed in claim 8, wherein the first transistor is a PMOS transistor.

11. The circuit as claimed in claim 8, wherein the control circuit further comprises a third transistor coupled to the second end of the at least one diode.

12. The circuit as claimed in claim 11, wherein the third transistor is an NMOS transistor.

13. The circuit as claimed in claim 8, wherein the second transistor is a PMOS transistor.

14. The circuit as claimed in claim 8, wherein the control circuit comprises a plurality of diodes.

15. An integrated circuit, comprising:
   signal receiving means for receiving an electrostatic signal;
   clamping means for directing the electrostatic signal to ground, the clamping means having a first end and a second end, the first end being coupled to the signal receiving means and the second end being coupled to ground; and
   control means having a first transistor coupled to the clamping means for providing a first voltage signal and a second voltage signal to trigger the clamping means to direct the electrostatic signal to ground, a second transistor, and at least one diode having a first end and a second end, the first transistor being coupled to the first end of the at least one diode, and the second transistor being coupled to the second end of the at least one diode, wherein the first voltage signal is different from the second voltage signal.

16. The circuit as claimed in claim 15, wherein the clamping means comprises an NMOS transistor.

17. The circuit as claimed in claim 15, wherein the clamping means comprises a PMOS transistor.

18. An integrated circuit, comprising:

signal receiving means for receiving an electrostatic signal;

clamping means for directing the electrostatic signal to ground, the clamping means having a first end and a second end, the first end being coupled to the signal receiving means and the second end being coupled to ground;

control means coupled to the clamping means for providing a first voltage signal and a second voltage signal to trigger the clamping means to direct the electrostatic signal to ground; and transient detection means coupled to the control means.

19. An integrated circuit, comprising:

a signal pad;

a clamping circuit including a first NMOS transistor having a drain, a source, a gate and a substrate, wherein the drain of the first NMOS transistor is coupled to the signal pad and the source of the first NMOS transistor is coupled to ground; and a control circuit having at least one transistor coupled to the gate and substrate of the first NMOS transistor and the signal pad, the control circuit providing a first bias voltage signal to the gate of the first NMOS transistor and a second bias voltage signal to the substrate of the first NMOS transistor to trigger the clamping circuit to discharge an electrostatic current, wherein the first bias voltage is greater than the second bias voltage.

20. The circuit as claimed in claim 19 further comprising a first diode having a first end and a second end and a second diode having a first end and a second end, wherein the first end of the first diode is coupled to the signal pad and the second end of the first diode is coupled to ground, and the first end of the second diode is coupled to a $V_{DD}$ signal and the second end of the second diode is coupled to the signal pad.

21. An integrated circuit, comprising:

a signal pad;

a clamping circuit including a first NMOS transistor having a drain, a source, a gate and a substrate, wherein the drain of the first NMOS transistor is coupled to the signal pad and the source of the first NMOS transistor is coupled to ground; and a control circuit coupled to the gate and substrate of the first NMOS transistor and the signal pad, the control circuit providing a first bias voltage signal to the gate and a second bias voltage signal to the substrate, wherein the first bias voltage is less than the second bias voltage.

22. An integrated circuit, comprising:

a signal pad;

a clamping circuit including a first NMOS transistor having a drain, a source, a gate and a substrate, wherein the drain of the first NMOS transistor is coupled to the signal pad and the source of the first NMOS transistor is coupled to ground; and a control circuit having at least one transistor coupled to the gate and substrate of the first NMOS transistor and the signal pad, the control circuit providing a first bias voltage signal to the gate of the first NMOS transistor and a second bias voltage signal to the substrate of the first NMOS transistor to trigger the clamping circuit to discharge an electrostatic current, wherein the control circuit comprises a plurality of serially coupled diodes, and the at least one transistor including:

a PMOS transistor having a source, a drain, a substrate and a gate, the source of the PMOS transistor being coupled to the signal pad, the drain of the PMOS transistor being coupled to a first of the plurality of serially coupled diodes; and a second NMOS transistor having a source, a drain, a gate, and a substrate, wherein the drain of the second NMOS transistor is coupled to a last of the serially coupled diodes, the source of the second NMOS transistor is coupled to ground, and the gate of the second NMOS transistor is coupled to the gate of the PMOS transistor.

23. The integrated circuit as claimed in claim 22, wherein the substrate of the first NMOS transistor is coupled to any one of the plurality of serially coupled diodes.

24. The integrated circuit as claimed in claim 22, wherein the gate of the first NMOS transistor is coupled to any one of the plurality of serially coupled diodes.

25. The integrated circuit as claimed in claim 22, wherein the gate of the PMOS transistor is coupled to a transient detection circuit.

26. The integrated circuit as claimed in claim 25, wherein the transient detection circuit comprises a resistor and a capacitor, wherein both the resistor and the capacitor are coupled to the gate of the PMOS transistor.

27. The circuit as claimed in claim 22, further comprising a first diode having a first end and a second end and a second diode having a first end and a second end, wherein the first end of the first diode is coupled to the signal pad and the second end of the first diode is coupled to ground, and the first end of the second diode is coupled to a $V_{DD}$ signal and the second end of the second diode is coupled to the signal pad.

28. An integrated circuit, comprising:

a signal pad;

a clamping circuit including a first PMOS transistor having a drain, a source, a gate and a substrate, wherein the drain of the first PMOS transistor is coupled to the signal pad and the source of the first PMOS transistor is coupled to a $V_{DD}$ signal; and a control circuit having at least one transistor coupled to the gate and substrate of the first PMOS transistor and the signal pad, the control circuit providing a first bias voltage signal to the gate of the first PMOS transistor and a second bias voltage signal to the substrate of the first PMOS transistor, wherein the control circuit comprises a plurality of serially coupled diodes, and the at least one transistor including:

an NMOS transistor having a source, a drain, a substrate and a gate, the source of the NMOS transistor being coupled to the signal pad, the drain of the NMOS transistor being coupled to a first of the plurality of serially coupled diodes; and a second PMOS transistor having a source, a drain, a gate, and a substrate, wherein the drain of the second PMOS transistor is coupled to a last of the serially coupled diodes, the source of the second PMOS transistor is coupled to a $V_{DD}$ signal, and the gate of the second PMOS transistor is coupled to the gate of the NMOS transistor.

29. The circuit as claimed in claim 28, wherein the control circuit provides the first bias voltage having a level equal to a level of the second bias voltage.

30. The circuit as claimed in claim 28 further comprising a first diode having a first end and a second end and a second diode having a first end and a second end, wherein the first end of the first diode is coupled to the signal pad and the second end of the first diode is coupled to the $V_{DD}$ signal and the first end of the second diode is coupled to ground and the second end of the second diode is coupled to the signal pad.

31. The integrated circuit as claimed in claim 28, wherein the substrate of the first PMOS is coupled to any one of the plurality of serially coupled diodes.

32. The integrated circuit as claimed in claim 28, wherein the gate of the first PMOS is coupled to any one of the plurality of serially coupled diodes.

33. An integrated circuit, comprising:
a signal pad;
a first clamping circuit including a first PMOS transistor having a drain, a source, a gate and a substrate, wherein the drain of the first PMOS transistor is coupled to the signal pad and the source of the first PMOS transistor is coupled to a $V_{DD}$ signal;
a first control circuit coupled to the gate and substrate of the first PMOS transistor and the signal pad, the first control circuit providing a first bias voltage signal to the gate of the first PMOS transistor and a second bias voltage signal to the substrate of the first PMOS transistor;
a second clamping circuit including a first NMOS transistor having a drain, a source, a gate and a substrate, wherein the drain of the first NMOS transistor is coupled to the signal pad and the source of the first NMOS transistor is coupled to ground; and
a second control circuit coupled to the gate and substrate of the first NMOS transistor and the signal pad, the control circuit providing a third bias voltage signal to the gate of the first NMOS transistor and a fourth bias voltage signal to the substrate of the first NMOS transistor.

34. An integrated circuit, comprising:
a signal pad;
a clamping circuit including a first PMOS transistor having a drain, a source, a gate and a substrate, wherein the drain of the first PMOS transistor is coupled to the signal pad and the source of the first PMOS transistor is coupled to a $V_{DD}$ signal; and
a control circuit having at least one transistor coupled to the gate and substrate of the first PMOS transistor and the signal pad, the control circuit providing a first bias voltage signal to the gate of the first PMOS transistor and a second bias voltage signal to the substrate of the first PMOS transistor, wherein the control circuit provides the first bias voltage having a level greater than a level of the second bias voltage.

35. An integrated circuit, comprising:
a signal pad;
a clamping circuit including a first PMOS transistor having a drain, a source, a gate and a substrate, wherein the drain of the first PMOS transistor is coupled to the signal pad and the source of the first PMOS transistor is coupled to a $V_{DD}$ signal; and
a control circuit having at least one transistor coupled to the gate and substrate of the first PMOS transistor and the signal pad, the control circuit providing a first bias voltage signal to the gate of the first PMOS transistor and a second bias voltage signal to the substrate of the first PMOS transistor, wherein the control circuit provides the first bias voltage having a level less than a level of the second bias voltage.

* * * * *

UNITED STATES PATENT AND TRADEMARK OFFICE
CERTIFICATE OF CORRECTION

PATENT NO. : 6,747,501 B2  
APPLICATION NO. : 09/903547  
DATED : June 8, 2004  
INVENTOR(S) : Ming-Dou Ker et al.

Page 1 of 1

It is certified that error appears in the above-identified patent and that said Letters Patent is hereby corrected as shown below:

Claim 15, Column 9, line 5, "diode, and" should read --diode and--.

Claim 30, Column 11, line 15, "signal and" should read --signal, and--.

Signed and Sealed this

Nineteenth Day of September, 2006

JON W. DUDAS  
*Director of the United States Patent and Trademark Office*